United States Patent [19]

Rose

[11] Patent Number: 4,499,371

[45] Date of Patent: Feb. 12, 1985

[54] ELECTRICAL CONNECTION SYSTEM

[75] Inventor: René Rose, Voisins-le-Bretonneux, France

[73] Assignee: Flonic S.A., Montrouge Cedex, France

[21] Appl. No.: 429,766

[22] Filed: Sep. 30, 1982

Related U.S. Application Data

[63] Continuation of Ser. No. 210,196, Nov. 25, 1980, abandoned.

[30] Foreign Application Priority Data

Nov. 27, 1979 [FR] France .............................. 79 29115

[51] Int. Cl.³ .............................................. G07F 3/02
[52] U.S. Cl. .................................... 235/492; 235/490; 235/487; 235/441
[58] Field of Search .............. 235/492, 487, 493, 488; 174/84 C; 339/18 R, 96; 194/4 F, 4 G, DIG. 26; 360/1, 2; 428/915, 916, 919, 939, 914

[56] References Cited

U.S. PATENT DOCUMENTS 4,007,355 2/1977 Moreno .............................. 235/492

Primary Examiner—G. Z. Rubinson
Assistant Examiner—Robert Lev
Attorney, Agent, or Firm—Dale Gaudier

[57] ABSTRACT

In an electrical connection system between a payment card (10) including an integrated memory circuit (11), and an information transfer apparatus (15) for reading and writing data in the memory circuit, terminals (14) of the card (10) are covered with a protective layer of a plastic material (13) which is perforable and recoverable (self-healing), and the transfer apparatus is provided, for each terminal, with a projection (16) of hard metal ending at a point (17) to be urged with a defined force on to the corresponding terminal in the card through the protective layer.

19 Claims, 4 Drawing Figures

ELECTRICAL CONNECTION SYSTEM

This is a continuation of application Ser. No. 210,196, filed Nov. 25, 1980 now abandoned.

This invention relates to an electrical connection system for an electric apparatus and a removable object carrying an electronic circuit.

More particularly, the invention is applicable to the temporary electrical connection of a card or the like (key, ring) carrying information stored in a memory forming part of an integrated circuit, to a transfer apparatus permitting the reading and/or writing of information in the card memory. Such a card can be used as an identification or access-control card, as a credit or payment card, and more generally as a transaction card for keeping account of banking or commercial operations, examples being described in more detail in U.S. Pat. Nos. 3,971,916, 4,007,355, 4,092,524, and 4,102,493. Hereinafter the term "memory card" will be used to refer to a card of the above type, whatever its purpose may be.

Electrical connection indicates the making of one or several electric contacts between the terminals of the electronic circuit contained in the memory card (contacted terminals) and the corresponding feeler terminals of the electrical apparatus (contacting terminals) to establish an electrical link between the circuitry of these two units and permit an exchange of data.

It is known that the terminals required for a memory card involve several more or less incompatible criteria:
(a) it is desirable to protect the terminals from contamination and wear which could interfere with the proper flow of current by inducing an unacceptably high voltage drop;
(b) it is also necessary to reduce the area occupied by the terminal surfaces, which is limited by the space available on the card, particularly in the case of a card of standard format;
(c) it is furthermore desirable that the connection should be made rapidly as soon as the card is disposed in position for contact by the terminals of the electrical apparatus.

The object of the invention is to provide a connection system in which the problems discussed above are substantially alleviated.

According to this invention there is provided an electrical connection system for an electric apparatus and a removable memory card or the like carrying an electronic circuit covered externally with a protective layer, to establish electrical contact between at least one pair of terminals disposed respectively in the apparatus and in the card, wherein: the said protective layer for the electronic circuit comprises, at least above the respective terminal, a plastic material which is perforable; and the said apparatus comprises at least one projection of hard metal ending at a point capable, in use, of being urged with a defined force through the protective layer on to the terminal in the card.

Preferably the said plastic material is also recoverable (i.e. self-healing).

The use in this way of a plastic protective material which can be perforated by the pressure of the point of the projection and which heals itself after the retraction thereof, in the case where the material is also recoverable, ensures permanent protection for the card terminals against contamination and corrosion by atmospheric agents to which exposed terminals would normally be susceptible. The use of a material which is merely perforable provides protection which is less satisfactory than if it were also recoverable, but which is nonetheless very advantageous in comparison to exposed, unprotected terminals in view of the fine size of the perforation.

In addition, establishing a quasi-pin-point contact with a given force results in a well-defined surface of mutual contact which, by appropriate choice of the metals involved, retains its dimensions after temporary contact has been established a large number of times.

It is also notable that the use of a projection with a pointed end as a contacting terminal requires only a limited space, as much for the implementation of a set of feeler terminals in the apparatus, for example in the form of a comb, as for the terminals which comprise the contacted terminals of the circuit carried in the memory card, and the dimensions of which can be of the same order as those of the pointed end of the projections.

Preferably the point at the end of a contacting projection has a radius of the order of 5 to 100 microns and is made of tungsten, which lends itself to the production of sharp ends by electrolytic techniques, or of steel; the contacted terminals of the card are chosen to be of a metal of lower hardness than tungsten or steel, such as copper, silver, indium and any other metal or alloy having satisfactory electrical properties.

Electrical connection systems in accordance with this invention will now be described, by way of example, with reference to the accompanying drawings, in which.

Figure 1:
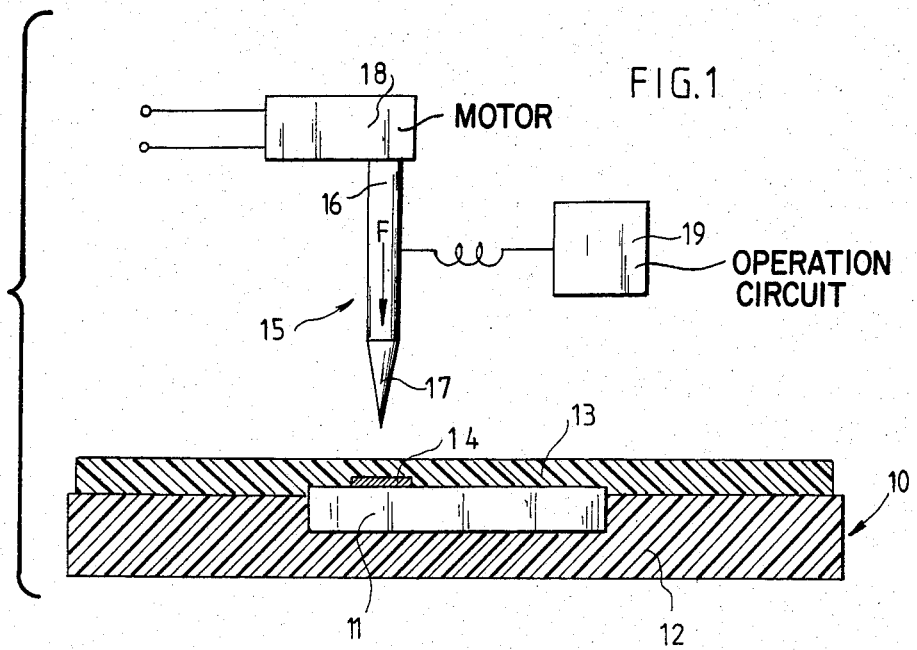
FIG. 1 shows schematically a connection system illustrating the principle of the invention.

Referring to FIG. 1, there is shown at 10 in transverse cross-section a removable or portable object in the form of a card, which includes an electronic circuit 11, for example an integrated circuit, mounted or embedded in a support 12 of insulating material, such as a polyester, and covered by a protective layer 13. The circuit 11 has at least one contact terminal 14 to which electrical connection is to be established with an apparatus 15 comprising a contacting terminal 16.

On the one hand the terminal 14 of the circuit 11 is covered by a protective layer 13 also covering the circuit 11, this protective layer being of a plastic material with the properties of being perforable and recoverable and having for example in the case of a standard card a thickness of the order of 0.2 mm. Such materials are for example the silicone elastomers, such as those manufactured by the company Rhone Poulenc under the reference RTV 141, CAF neutral; on the other hand, the contacting terminal 16 of the apparatus 15 comprises a projection of hard metal ending at a point 17. This metal is, for example, tungsten which has an appropriately high hardness and which permits the production by electrolytic techniques of very sharp points having a radius of the order of 5 to 100 microns, or else a metal which is harder than the material of the contacted terminal, for example steel.

To establish connection between the units 10 and 15, the point 17 of the projection 16 can be brought into contact with the terminal 14 by a downward vertical movement along its axial direction F, and urged against it with a defined force, for example by means of an auxiliary device 18 such as an electromagnetic motor the mobile coil of which is movable in the annular field of a permanent magnet. This auxiliary device can be controlled either by an operator, or, in the case of a transaction card, automatically by the transfer apparatus in the course of an operation to read and/or write data in the memory of the electronic circuit.

Under this force, the material of the layer 13 will first flow and then be perforated by the point 17 of the projection 16. Upon retraction of the point, the material tends to recover naturally its initial form and to close itself over the perforation hole, re-ensuring protection for the terminal 14 in relation to external agents. The projection 16 is coupled by a flexible lead to an external operation circuit 19 such as a data processor.

The metal forming the terminal 14 is chosen to have a hardness lower than that of the tungsten forming the projection 16, for example copper, silver, indium or any metal or alloy having appropriate conductivity characteristics. The force with which the projection 16 is urged on to the terminal 14 is selected in accordance with the radius of the point 17 and the nature of the metal constituting the terminal; the depth of penetration of the point into the combination of parts 13-14, varying in dependence upon the above factors, determines the area of contact for a point 17 of a given radius.

Figure 2:
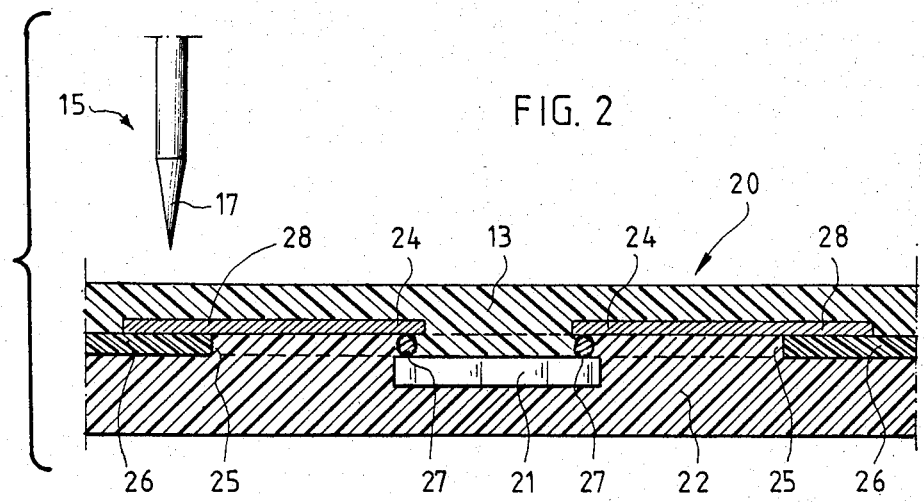
FIG. 2 shows a first form of a card containing an electronic circuit suitable for connection to an external apparatus by the system of FIG. 1.

The principle of this connection can be applied to semi-conductor circuits mounted on flexible film, commonly called TAB (tape automated bonding), as is shown in FIG. 2. In this case, the memory card 20 comprises a support 22 of insulating material on which is mounted an electronic circuit 21 in the form of an integrated circuit chip secured by its leads 24 to the edges of an opening 25 formed in a flexible film 26, these leads 24 having one end soldered to a stud 27 of the chip and the other end 28 fixed to an edge of the opening 25 and forming a test pad. The assembly is, as before in the case of FIG. 1, covered with a protective layer 13 of perforable and recoverable plastic material. In this form of the card 20, the connection with the apparatus 15 is established on the test pad at the end 28 of each lead 24.

In order to avoid any sparking which could risk damage to the protective layer 13, it is envisaged that there would always be a delay arrangement permitting the flow of current in the connection only after contact has actually been made between the point 17 and the terminal 14 or the end 28 of the lead 24. It has been found in practice that the electrical resistance of such a connection was less than 0.15 ohms for a current of 0.3 A.

In the case where the circuit in the form of FIG. 1 or FIG. 2 has several terminals in line, the apparatus comprises a set of a corresponding number of pointed projections like the projection 16, arranged to form one or more combs the downward movement of which is controlled by the same device.

It will be understood that the apparatus cooperates in known manner with means for transporting and stopping the card permitting it to be moved and positioned with precision relative to the contacting terminals of the apparatus so that these should be aligned with the terminals of the card when downward movement is effected in order to establish electrical connection.

Figure 3:
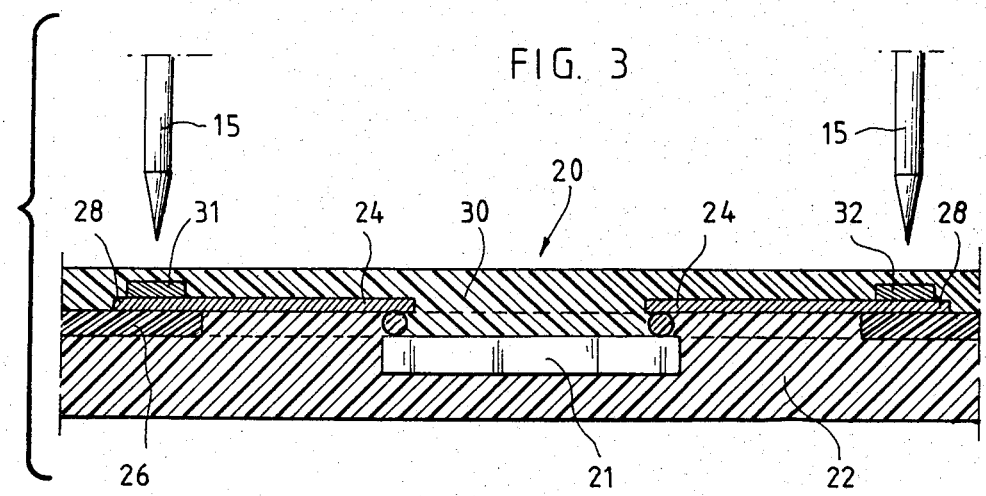
FIGS. 3 and 4 are respectively a cross-section and a partially cut-away perspective view of another form of the card of FIG. 2.
Figure 4:
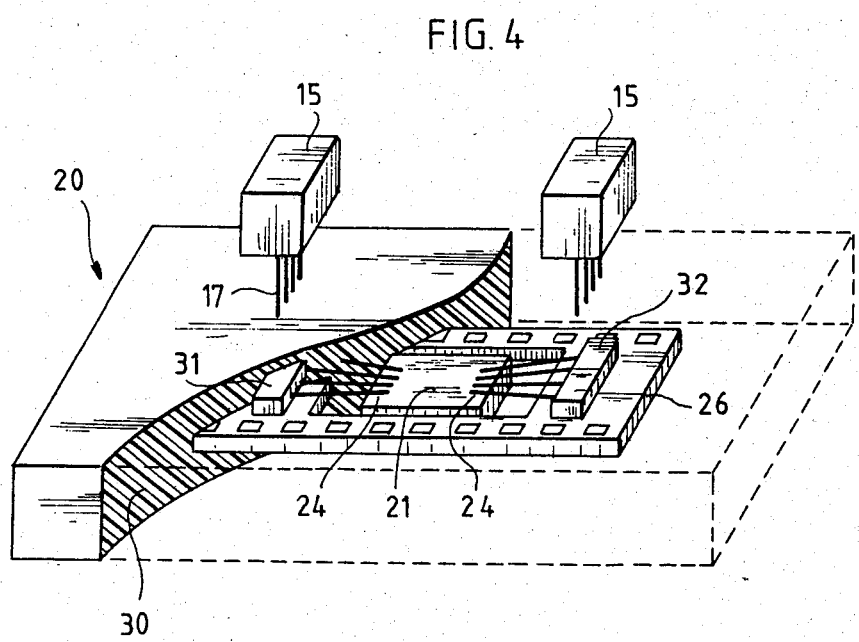

In the above-described figures, the card including the electronic circuit has been shown as being entirely covered by the protective layer of perforable and recoverable material. In fact, the presence of this layer is only necessary in the effective zone of contact above the terminals, and the remainder of the object can be covered by an auxiliary protective layer of any appropriate material, since that will not have to sustain perforation. It is further envisaged that this auxiliary protective layer could cover the layer of perforable and recoverable material, provided that its thickness is relatively small at that position (of the order of 5 microns). Such an implementation is shown in FIGS. 3 and 4, which differ from that of FIG. 2 only in the presence of two "windows" 31 and 32 of perforable and recoverable plastic material disposed in the zone overlying the ends 28 of the leads 24 at the positions of contact of these leads (four in number as shown in FIG. 4) with the points 17 of the apparatus 15. These windows 31, 32 have for example dimensions a little greater than those of the combs comprising the sets of these points. In addition, the whole of the object is covered by a layer 30 of insulating material, for example of polyester, in which are embedded the circuit 21 with its leads 24, the film 26 and the windows 3, 32.

What is claimed is:

1. A system for establishing an electrical connection between a portable memory card carrying an electronic circuit covered externally with a protective layer and electrical apparatus for reading said card, wherein:
    said card includes at least a pair of discrete coplanar terminals disposed therein and connected to said electronic circuit, and a protective layer disposed over at least each of said card terminals formed from a perforable plastic material; and
    said electrical apparatus includes at least one pair of electrically conductive probes having tips disposed in the same plane, means for axially urging said probe tips through said protective layer and into contact with said card terminals and a source of electrical current for said probe tips, whereby said probe tips simultaneously contact said terminals to establish an electrical connection between said electrical apparatus and said electronic circuit.

2. The system of claim 1, wherein said plastic material is also self-healing.

3. The system of claim 1, wherein said plastic material is a silicone elastomer.

4. The system of claim 1, wherein the tips of said probes are formed of a hard conductive metal or alloy.

5. The system of claim 4, wherein said probe tips are formed from tungsten or steel.

6. The system of claim 4, wherein each said card terminal is formed from a conductive metal or alloy of lower hardness than said tips.

7. The system of claim 6, wherein said terminals are formed from the group of metals including copper, silver, indium or alloys thereof.

8. The system of claim 1, wherein the radius of each of said probe tips is between 5 and 100 microns.

9. The system of claim 1, wherein said protective layer of perforable material is limited to the useful zone of contact between each said card terminal and the tip of each said probe.

10. The system of claim 1, wherein said card terminals are secured to said protective layer.

11. The system of claim 10, wherein said electronic circuit, said card terminals and said protective layer are embedded in an auxiliary protective layer.

12. The system of claim 1, wherein said electronic circuit includes a memory means.

13. The system of claim 1, wherein said electrical apparatus includes data processor means.

14. Electronic transaction apparatus comprising:
a portable memory card including electronic memory means for storing data therein and at least a pair of discrete coplanar terminals connected to the memory means, at least the pair of terminals and the memory means being covered with a protective layer formed from a perforable plastic material; and data transfer apparatus including:
at least a pair of electrically conductive probes having tips disposed coplanar to each other and spaced apart for contacting the terminals of the memory card;
means for axially urging the probe tips through the protective layer of the card to cause the probe tips to contact the card terminals; and
means, connected to the probe tips, for supplying electrical power to energize the electronic memory means and for reading and writing data between the data transfer apparatus and the memory means.

15. A portable memory card for use with a data transfer apparatus of the type having at least one pair of electrically conducting probes having tips, comprising:

a support of insulating material having a substantially flat face;
an integrated circuit chip mounted on said face of said support;
at least a pair of conductive coplanar terminals disposed substantially adjacent said integrated circuit chip;
means for connecting said circuit chip with said conductive terminals; and
an external elastic protective layer disposed on said substantially flat face, said protective layer comprising a perforable plastic material disposed over at least said conductive terminals, whereby said plastic material may be perforated by said probe tips of said apparatus in order to establish an electrical contact between said tips and said terminals.

16. The portable memory card of claim 15 wherein said plastic material is self healing.

17. The portable memory card of claim 15 wherein said plastic material is a silicone elastomer.

18. The portable memory card of claim 15 wherein said terminals are disposed in the same plane as said integrated circuit chip.

19. The portable memory card of claim 15 wherein said terminals are disposed on said integrated circuit chip.

* * * * *